(12) United States Patent
Yamashita

(10) Patent No.: US 7,915,932 B2
(45) Date of Patent: Mar. 29, 2011

(54) SEMICONDUCTOR INTEGRATED CIRCUIT

(75) Inventor: Takahiro Yamashita, Sumida-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 12/537,447

(22) Filed: Aug. 7, 2009

(65) Prior Publication Data

US 2010/0039154 A1    Feb. 18, 2010

(30) Foreign Application Priority Data

Aug. 12, 2008    (JP) .................................. 2008-207680

(51) Int. Cl.
    *H03L 7/06*    (2006.01)
(52) U.S. Cl. ............ 327/156; 327/3; 327/147; 327/261; 327/291
(58) Field of Classification Search .............. 327/3, 156, 327/261, 291; 326/93, 94
    See application file for complete search history.

(56) References Cited

U.S. PATENT DOCUMENTS

| | | | | |
|---|---|---|---|---|
| 5,815,041 | A * | 9/1998 | Lee et al. ........................... | 331/8 |
| 6,801,094 | B2 * | 10/2004 | Aoki et al. ...................... | 331/25 |
| 6,882,172 | B1 | 4/2005 | Suzuki et al. | |
| 6,885,210 | B1 | 4/2005 | Suzuki | |
| 7,423,456 | B2 * | 9/2008 | Gomm et al. .................... | 327/12 |
| 7,538,591 | B2 * | 5/2009 | Oh ............................... | 327/156 |

FOREIGN PATENT DOCUMENTS

| | | |
|---|---|---|
| JP | 11-101851 | 4/1999 |
| JP | 2008-102083 | 5/2008 |

OTHER PUBLICATIONS

James W. Tschanz et al., "Effectiveness of Adaptive Supply Voltage and Body Bias for Reducing Impact of Parameter Variations in Low Power and High Performance Microprocessors", IEEE Journal of Solid-State Circuits, vol. 38, No. 5, May 2003, pp. 826-829.

* cited by examiner

*Primary Examiner* — Lincoln Donovan
*Assistant Examiner* — John W Poos
(74) *Attorney, Agent, or Firm* — Oblon, Spivak, McClelland, Maier & Neustadt, L.L.P.

(57) ABSTRACT

A semiconductor integrated circuit comprises: a first signal delay circuit including a first precharge element configured to precharge a first node with a leakage current and a first signal output circuit configured to output a first signal; a second signal delay circuit including a second precharge element configured to precharge a second node with a leakage current and a second signal output circuit configured to output a second signal. The first signal delay circuit is configured to discharge the first node via a first discharge element, while the second signal delay circuit precharges the second node via the second precharge element and outputs the second signal. The second signal delay circuit is configured to discharge the second node via a second discharge element, while the first signal delay circuit precharges the first node via the first precharge element and outputs the first signal.

20 Claims, 6 Drawing Sheets

US 7,915,932 B2

SEMICONDUCTOR INTEGRATED CIRCUIT

CROSS REFERENCE TO RELATED APPLICATIONS

This application is based on and claims the benefit of priority from prior Japanese Patent Application No. 2008-207680, filed on Aug. 12, 2008, the entire contents of which are incorporated herein by reference.

BACKGROUND OF THE INVENTION

1. Field of the Invention

The present invention relates to a semiconductor integrated circuit, and more particularly, to a semiconductor integrated circuit that measures leakage currents flowing in transistors formed on a semiconductor substrate.

2. Description of the Related Art

Conventionally, there have been known various measuring devices for measuring a quality of a semiconductor integrated circuit formed on a semiconductor substrate (see Japanese Patent Application Laid-Open No. 11-101851). Japanese Patent Application Laid-Open No. 11-101851 discloses a delay time measuring circuit and a delay time measuring method for determining whether a semiconductor integrated circuit being tested is acceptable by measuring a transmission delay time in the semiconductor integrated circuit.

There has also been a known structure that restricts variations in transistor characteristics in the semiconductor integrated circuit by measuring a leakage current in the transistor of the semiconductor integrated circuit and controlling a source voltage and a substrate bias in the semiconductor integrated circuit based on the measurement result. To measure the quality of each transistor formed on the semiconductor substrate, four-terminal transistors may be provided as a process monitor on a chip dicing line. In this case, however, it is necessary to prepare a special-purpose external measuring device that is connected to the transistors on the dicing line and measures the quality of each transistor. With this method, there is another problem that it is difficult to detect the locations of the transistors, after chips are cut out.

As a transistor quality measuring method to counter those problems, there has been a method by which a monitor circuit is provided in the form of a ring oscillator or delay chain together with a semiconductor integrated circuit formed on each chip (disclosed by Tschanz, J. W., Narendra, S., Nair, R., and De, V., "Effectiveness of adaptive supply voltage and body bias for reducing impact of parameter variations in low power and high performance microprocessors", IEEE Journal of Solid-State Circuits, May 2003, Volume 38, Issue 5, p.p. 826-829). In the transistor measuring device using ring oscillators disclosed by Tschanz, et al, however, the rise time and the fall time of n-MOS transistors and p-MOS transistors affect respectively. As a result, the characteristics of the n-MOS transistors cannot be detected separately from the characteristics of the p-MOS transistors.

SUMMARY OF THE INVENTION

A semiconductor integrated circuit according to one aspect of the present invention includes: a first signal delay circuit including a first discharge element having one end connected to a first node and configured to be switched between a conductive state and a nonconductive state by a first control signal to discharge the first node, a first precharge element connected between the first node and a power supply and configured to precharge the first node with a leakage current, and a first signal output circuit configured to compare a potential of the first node with a reference potential to output a first signal; a second signal delay circuit including a second discharge element having one end connected to a second node and configured to be switched between a conductive state and a nonconductive state by a second control signal to discharge the second node, a second precharge element connected between the second node and a power supply and configured to precharge the second node with a leakage current, and a second signal output circuit configured to compare a potential of the second node with a reference potential to output a second signal; a pulse signal generating circuit configured to generate a pulse signal having a pulse width determined by the first and second signals; a first delay circuit configured to delay the pulse signal to output the first control signal; and a second delay circuit configured to delay an inverted signal of the pulse signal to output the second control signal, the first signal delay circuit being configured to discharge the first node via the first discharge element, while the second signal delay circuit precharges the second node via the second precharge element and outputs the second signal; and the second signal delay circuit being configured to discharge the second node via the second discharge element, while the first signal delay circuit precharges the first node via the first precharge element and outputs the first signal.

A semiconductor integrated circuit according to another aspect of the present invention includes: a third signal delay circuit including a third precharge element connected between a third node and a power supply and configured to be switched between a conductive state and a nonconductive state by a third control signal to precharge the third node, a third discharge element having one end connected to the third node and configured to discharge the third node with a leakage current, and a third signal output circuit configured to compare a potential of the third node with a reference potential to output a third signal; a fourth signal delay circuit including a fourth precharge element connected between a fourth node and a power supply and configured to be switched between a conductive state and a nonconductive state by a fourth control signal to precharge the fourth node, a fourth discharge element having one end connected to the fourth node and configured to discharge the fourth node with a leakage current, and a fourth signal output circuit configured to compare a potential of the fourth node with a reference potential to output a fourth signal; a pulse signal generating circuit configured to generate a pulse signal having a pulse width determined by the third and fourth signals; a third delay circuit configured to delay the pulse signal to output the third control signal; and a fourth delay circuit configured to delay an inverted signal of the pulse signal to output the fourth control signal, the third signal delay circuit being configured to precharge the third node via the third precharge element, while the fourth signal delay circuit discharges the fourth node via the fourth discharge element and outputs the fourth signal; and the fourth signal delay circuit being configured to precharge the fourth node via the fourth precharge element, while the third signal delay circuit discharges the third node via the third discharge element and outputs the third signal.

A semiconductor integrated circuit according to still another aspect of the present invention includes: a first signal output circuit including a first precharge element connected between a first node and a power supply and configured to precharge the first node with a leakage current, the first signal output circuit being configured to output a first signal corresponding to a precharge speed of the first node; a second signal output circuit including a second precharge element connected between a second node and a power supply and configured to precharge the second node with a leakage current, the second signal output circuit being configured to output a second signal corresponding to a precharge speed of the second node; and a pulse signal generating circuit configured to generate a pulse signal having a pulse width determined by the first and second signals, the first signal output circuit being configured to discharge the first node, while the second signal output circuit precharges the second node via the second precharge element and outputs the second signal; and the second signal output circuit being configured to discharge the second node, while the first signal output circuit precharges the first node via the first precharge element and outputs the first signal.

DETAILED DESCRIPTION OF THE EMBODIMENTS

The following is a description of embodiments of the present invention, with reference to the accompanying drawings.

First Embodiment

Structure of the Semiconductor Integrated Circuit of the First Embodiment

Figure 1:
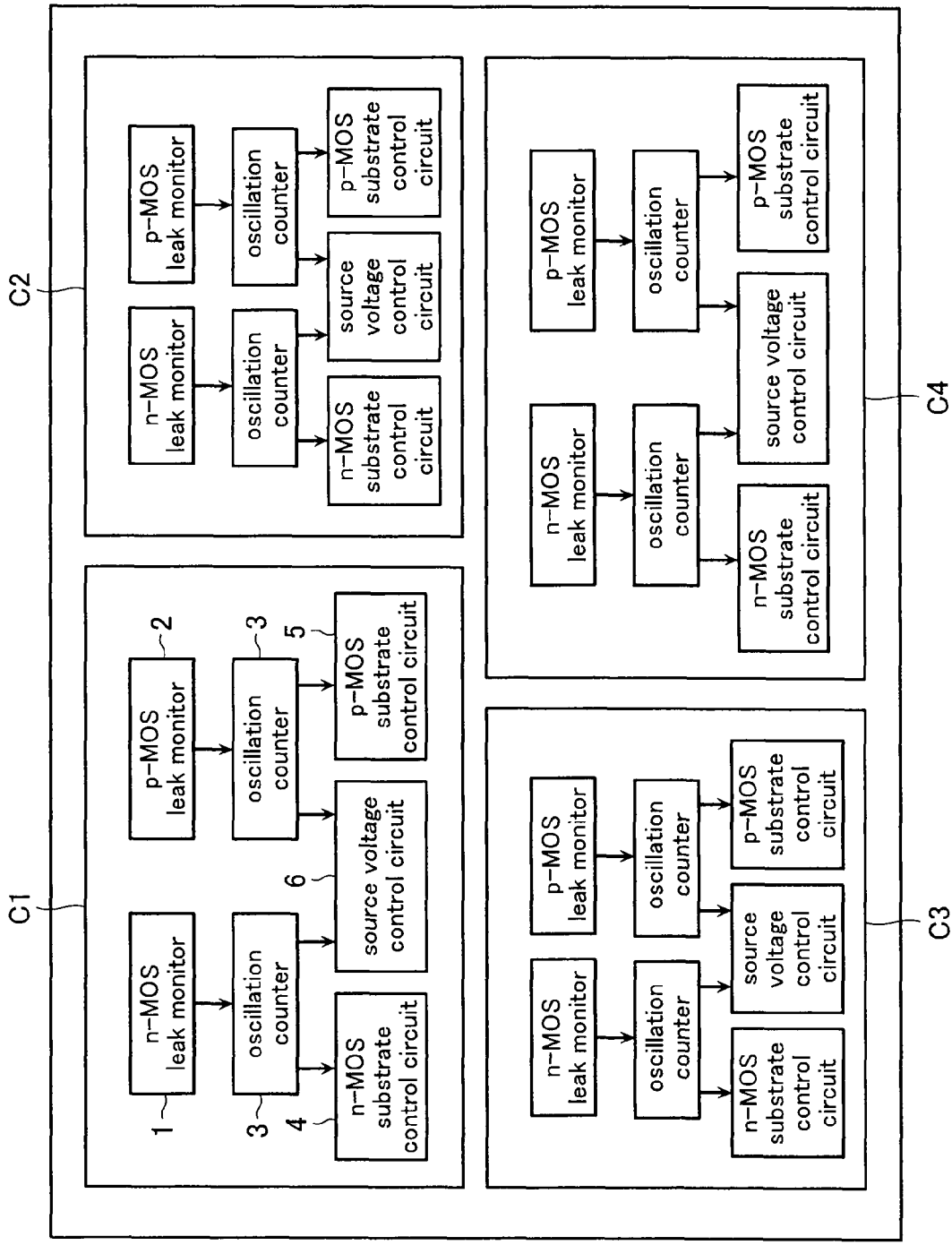
FIG. 1 is a block diagram showing a structure of a semiconductor integrated circuit in accordance with a first embodiment.

FIG. 1 shows a fundamental structure of a semiconductor integrated circuit in accordance with an embodiment of the present invention, or structures of cores C having an integrated circuit formed on a semiconductor substrate and control circuits formed in the cores C.

As shown in FIG. 1, the cores C (C1 through C4 in this embodiment) are formed on the semiconductor substrate. The control circuits are provided in the respective cores C1 through C4. The control circuits measure the characteristics of transistors of the respective cores C. Based on the measured characteristics of the transistors, the source voltage and substrate bias of each core C are controlled, and variations in the transistor characteristics are restricted. In this embodiment, description is made of a structure in which a leakage current of each n-MOS transistor is measured, and the source voltage and substrate bias are controlled based on the measured characteristics of the n-MOS transistor. On the other hand, in a second embodiment that will be described later, description is made of a structure in which a leakage current of each p-MOS transistor is measured, and the source voltage and substrate bias are controlled based on the measured characteristics of the p-MOS transistor. The leakage current measurement may be collectively carried out on n-MOS transistors and p-MOS transistors.

Although only the structure of each control circuit in the cores C is shown in FIG. 1 for ease of explanation, a semiconductor integrated circuit is provided in each of the cores C, so that the cores C perform the respective certain operations. The cores C are not limited to arithmetic cores, but may be memory macros, small block units each forming part of a memory macro, or large block units each including arithmetic core group or the like.

The control circuit in each of the cores C includes an n-MOS leak monitor 1, a p-MOS leak monitor 2, an oscillation counter 3, an n-MOS substrate control circuit 4, a p-MOS substrate control circuit 5, and a source voltage control circuit 6.

The n-MOS leak monitor 1 measures the leakage current flowing in the n-MOS transistors formed in the core C. The p-MOS leak monitor 2 measures the leakage current flowing in the p-MOS transistors formed in the core C. The n-MOS leak monitor 1 and the p-MOS leak monitor 2 output pulse signals having a pulse width based on the leakage current amounts of the respective transistors.

The oscillation counter 3 counts the number of oscillation of the pulse signal output from the n-MOS leak monitor 1 or the p-MOS leak monitor 2 within a certain period, so as to measure the leakage current amount of the n-MOS or p-MOS transistors. The n-MOS substrate control circuit 4 and the p-MOS substrate control circuit 5 each apply a forward substrate bias to the semiconductor substrate, if the leakage current amount of the n-MOS or p-MOS transistor is smaller than a certain value. The n-MOS substrate control circuit 4 and the p-MOS substrate control circuit 5 each apply a reverse substrate bias to the semiconductor substrate, if the leakage current amount of the n-MOS or p-MOS transistor is larger than the certain value. The source voltage control circuit 6 reduces the source voltage, if the leakage current amount of the n-MOS or p-MOS transistor is smaller than a certain value. The source voltage control circuit 6 increases the source voltage, if the leakage current amount of the n-MOS or p-MOS transistor is larger than the certain value. The n-MOS substrate control circuit 4, the p-MOS substrate control circuit 5, and the source voltage control circuit 6 may be designed to control the substrate bias and the source voltage, so that the number of oscillations, which is dependent on the leakage current amount of each transistor and counted by the oscillation counter 3, has a constant value.

Figure 2:
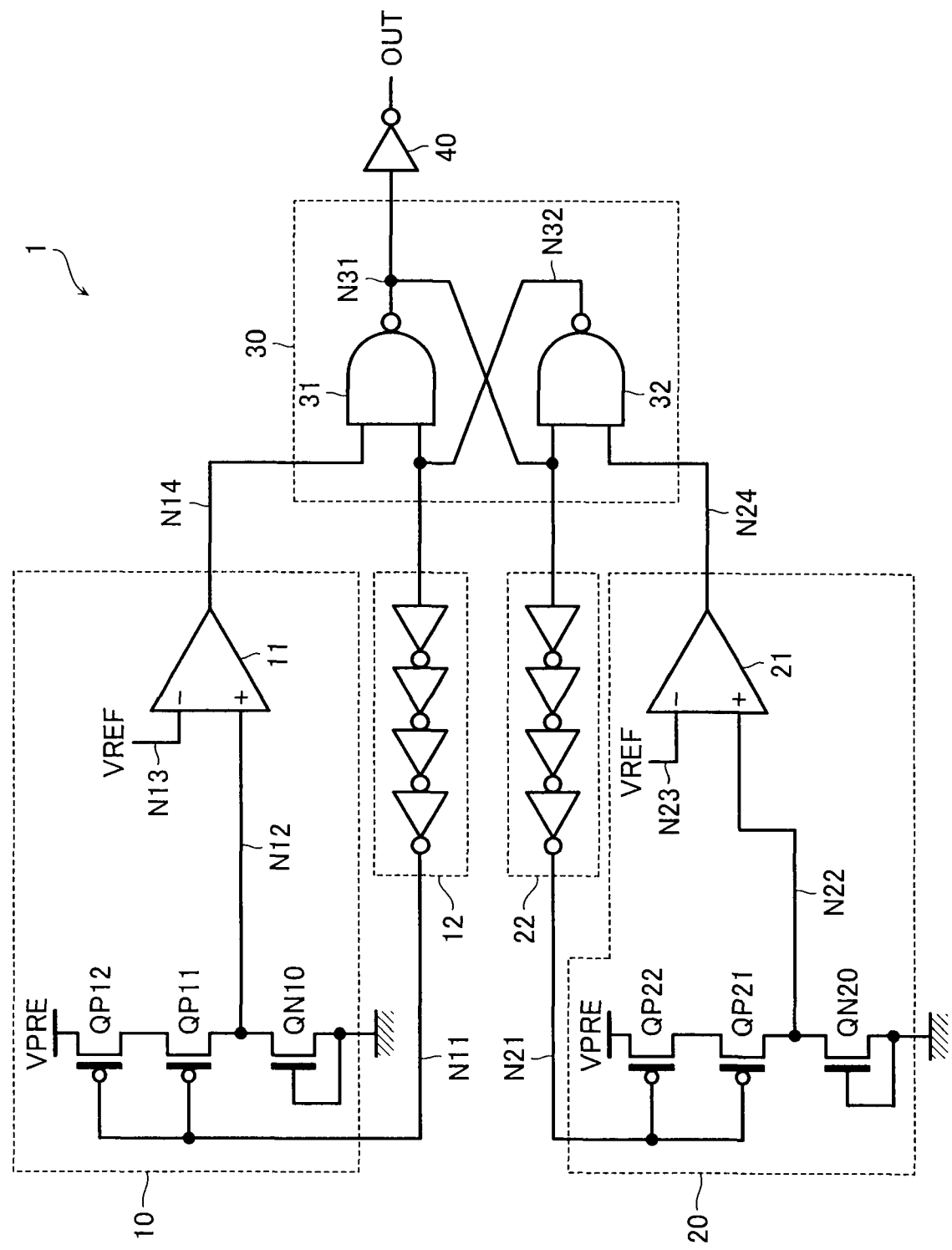
FIG. 2 is a circuit diagram showing the semiconductor integrated circuit in accordance with the first embodiment.

Referring now to FIG. 2, an example structure of the n-MOS leak monitor 1 is described. FIG. 2 is a circuit diagram showing the example structure of the n-MOS leak monitor 1 in accordance with this embodiment.

The n-MOS leak monitor 1 includes signal delay circuits 10 and 20, delay circuits 12 and 22, a pulse signal generating circuit 30, and an inverter 40.

The signal delay circuit 10 includes p-MOS transistors QP11 and QP12, an n-MOS transistor QN10, and a comparator 11.

The two p-MOS transistors QP11 and QP12 are connected in series. The source of the transistor QP12 is connected to a power supply VPRE (a voltage Vpre), and the drain of the transistor QP11 is connected to a node N12. A node N11 is connected to the gates of the two transistors QP11 and QP12. When the potential of the node N11 is in a "L" state, the two transistors QP11 and QP12 become conductive, so as to precharge the node N12 up to the voltage Vpre of the power supply VPRE and increase the potential of the node N12.

The n-MOS transistor QN10 has its drain connected to the node N12, and has its gate and source grounded. The transistor QN10 discharges the node N12 by the leakage current flowing from the drain thereof connected to the node N12 to the grounded source thereof, so as to reduce the potential of the node N12. The n-MOS leak monitor 1 measures the leakage current amount of the n-MOS transistor QN10. Here, the transistor QN10 subject to the leakage current measurement is formed by the same procedures as the transistors used in the other circuits in the cores C, and has a certain relationship with other n-MOS transistors in the cores C in terms of characteristics.

The comparator 11 has input terminals connected to the node N12 and a node N13 connected to a power supply VREF (a potential Vref). If the potential of the node N12 is higher than the potential Vref of the node N13, the comparator 11 outputs a "H" signal to a node N14. If the potential of the node N12 is lower than the potential Vref of the node N13, the comparator 11 outputs a "L" signal to the node N14.

The signal delay circuit 10, as a whole, delays the signal input from the node N11 by the amount based on the leakage current amount of the n-MOS transistor QN10, and outputs the delayed signal to the node N14.

The delay circuit 12 is formed by a plurality of inverters as buffers. The delay circuit 12 delays the later-described "H" signal or "L" signal of a node N32 output from the pulse signal generating circuit 30 by a certain amount of time. The delay circuit 12 then provides the delayed signal to the node N11.

The signal delay circuit 20 includes p-MOS transistors QP21 and QP22, an n-MOS transistor QN20, and a comparator 21. The transistors QP21 and QP22 of the signal delay circuit 20 are equivalent to the transistors QP11 and QP12 of the signal delay circuit 10, and the n-MOS transistor QN20 and the comparator 21 have the same structures as the n-MOS transistor QN10 and the comparator 11, respectively. Therefore, explanation of them is omitted herein.

In the signal delay circuits 10 and 20 in the n-MOS leak monitor 1, while discharging is performed on one of the nodes (the node N12, for example) and the leakage current amount of the transistor QN10 is measured, precharging is performed on the other node (the node N22, for example). Accordingly, the precharging time of each of the nodes N12 and N22 does not affect the leakage current measurement based on the discharging time of each of the n-MOS transistors QN10 and QN20.

The delay circuit 22 is formed by a plurality of inverters as buffers. The delay circuit 22 delays the later-described "H" signal or "L" signal of a node N31 output from the pulse signal generating circuit 30 by a certain amount of time. The delay circuit 22 then provides the delayed signal to the node N21.

The pulse signal generating circuit 30 is a set/reset flip-flop circuit that has the node N14 and the node N24 connected to the input terminals of a logic gate 31 and a logic gate 32, respectively. The pulse signal generating circuit 30 generates a pulse signal that has a pulse width determined based on the signals of the node N14 and the node N24. The pulse signal is output as an output signal of the n-MOS leak monitor 1 via the inverter 40. The node N31 connected to the output terminal of the logic gate 31 is also connected to the node N21 via the delay circuit 22, and the node N32 connected to the output terminal of the logic gate 32 is also connected to the node N11 via the delay circuit 12.

Operation of the Semiconductor Integrated Circuit of the First Embodiment

Figure 3:
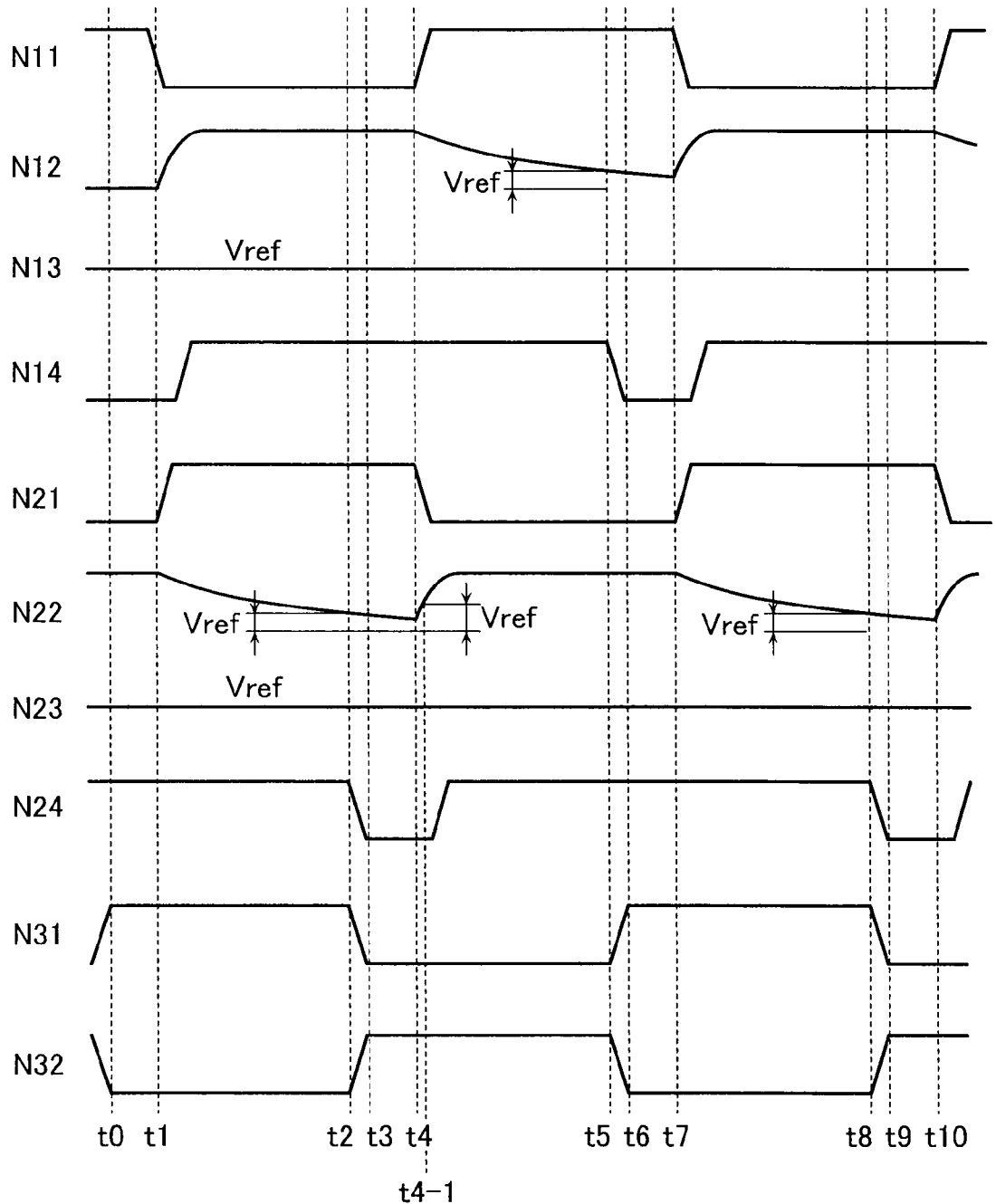
FIG. 3 is a timing chart showing the potentials of the respective nodes in the operation of the semiconductor integrated circuit in accordance with the first embodiment.

Referring now to FIG. 3, the operation of the n-MOS leak monitor 1 is described. FIG. 3 is a timing chart showing the potentials of the respective nodes in the operation of the n-MOS leak monitor 1 in accordance with this embodiment.

The n-MOS leak monitor 1 starts measuring the leakage currents of the n-MOS transistors QN10 and QN20, as the semiconductor integrated circuit starts operating. At time t0, the states of the nodes N31 and N32 that are output from the two logic gates 31 and 32 of the pulse signal generating circuit 30 switch from a "L" state to a "H" state, and from a "H" state to a "L" state, respectively. At time t0, each of the potentials of the nodes N11, N22, and N24 is in a "H" state, and each of the potentials of the nodes N12, N24, and N21 is in a "L" state.

At time t1, the potential of the node N31 in the "H" state is supplied to the node N21, with a certain delay being caused by the delay circuit 22. As a result, the node N21 changes from the "L" state to the "H" state. Likewise, the potential of the node N32 in the "L" state is supplied to the node N11, with a certain delay being caused by the delay circuit 12. As a result, the node N11 changes from the "H" state to the "L" state. Here, the delay time caused by the delay circuits 12 and 22 is expressed as t1-t0.

Since the potential of the node N11 is in the "L" state, the gate of each of the p-MOS transistors QP11 and QP12 is put into the "L" state. As a result, the p-MOS transistors QP11 and QP12 become conductive, and the node N12 is precharged by the power supply VPRE to have its potential switched to the "H" state. When the potential of the node N12 exceeds the potential Vref of the node N13, the output signal of the comparator 11 is inverted, and the potential of the node N14 switches from the "L" state to the "H" state.

Meanwhile, due to the "H"-state potential supplied to the node N21, the p-MOS transistors QP21 and QP22 become nonconductive, and the precharging of the node N22 is stopped. A leakage current flows from the node N22 having the precharging stopped via the transistor QN20, and the potential gradually becomes smaller.

At time t2, when the potential of the node N22 becomes lower than the potential Vref of the node N23, the "H" state of the node N24 output from the comparator 21 is inverted to the "L" state.

At time t3, the potential of the node N24 switches from the "H" state to the "L" state, and the output signal of the pulse signal generating circuit 30 is also inverted. Accordingly, the "L" state of the node N24 is supplied to the logic gate 32, and the node N32 switches from the "L" state to the "H" state. The "H" state of the node N32 and the "H" state of the node N14 are supplied to the logic gate 31, and the node N31 switches from the "H" state to the "L" state.

At time t4, the potential of the node N32 having switched to the "H" state is supplied to the node N11, with a certain delay being caused by the delay circuit 12. As a result, the node N11 switches from the "L" state to the "H" state. Likewise, the potential of the node N31 having switched to the "L" state is supplied to the node N21, with a certain delay being caused by the delay circuit 22. As a result, the node N21 switches from the "H" state to the "L" state. Here, the delay time caused by the delay circuits 12 and 22 is expressed as t4−t3 (=t1−t0).

Due to the "H"-state potential supplied to the node N11, the p-MOS transistors QP11 and QP12 become nonconductive, and the precharging of the node N12 is stopped after time t4.

A leakage current flows from the node N12 having the precharging stopped via the transistor QN10, and the potential gradually becomes smaller.

Since the potential of the node N21 is in the "L" state, the gate of each of the p-MOS transistors QP21 and QP22 is put into the "L" state. As a result, the p-MOS transistors QP21 and QP22 become conductive, and the node N22 is precharged by the power supply VPRE to have its potential switched to the "H" state. When the potential of the node N22 exceeds the potential Vref of the node N23 (time t4–1), the output signal of the comparator 21 is inverted, and the potential of the node N24 switches from the "L" state to the "H" state.

As described above, in the n-MOS leak monitor 1, while discharging is performed on the node N12 of the signal delay circuit 10 and the amount of the leakage current flowing in the transistor QN10 is measured, precharging is performed on the node N22 of the signal delay circuit 20. Accordingly, the precharging time of the node N22 does not affect the leakage current measurement based on the discharging time of the n-MOS transistor QN10.

At time t5, when the potential of the node N12 becomes lower than the potential Vref of the node N13, the "H" state of the node N14 output from the comparator 11 is inverted to the "L" state.

At time t6, the potential of the node N14 switches from the "H" state to the "L" state, and the output signal of the pulse signal generating circuit 30 is also inverted. Accordingly, the "L" state of the node N14 is supplied to the logic gate 31, and the node N31 switches from the "L" state to the "H" state. The "H" state of the node N31 and the "H" state of the node N24 are supplied to the logic gate 32, and the node N32 switches from the "H" state to the "L" state.

At time t7, the potential of the node N31 having switched to the "H" state is supplied to the node N21, with a certain delay being caused by the delay circuit 22. As a result, the node N21 switches from the "L" state to the "H" state. Likewise, the potential of the node N32 having switched to the "L" state is supplied to the node N11, with a certain delay being caused by the delay circuit 12. As a result, the node N11 switches from the "H" state to the "L" state. Here, the delay time caused by the delay circuits 12 and 22 is expressed as t7–t6 (=t4–t3=t1–t0).

Since the potential of the node N11 is in the "L" state, the gate of each of the p-MOS transistors QP11 and QP12 is put into the "L" state. As a result, the p-MOS transistors QP11 and QP12 become conductive, and the node N12 is precharged by the power supply VPRE to have its potential switched to the "H" state. When the potential of the node N12 exceeds the potential Vref of the node N13, the output signal of the comparator 11 is inverted, and the potential of the node N14 switches from the "L" state to the "H" state.

Due to the "H"-state potential supplied to the node N21, the p-MOS transistors QP21 and QP22 become nonconductive, and the precharging of the node N22 is stopped after time t7. A leakage current flows from the node N22 having the precharging stopped via the transistor QN20, and the potential gradually becomes smaller.

At time t8, the potentials of the respective nodes become the same as the potentials observed at time t2. At time t8, time t9, time t10 . . . , the n-MOS leak monitor 1 repeats a procedure carried out at time t2, time t3, time t4 . . . , in a similar way.

Accordingly, the state of the node N31 repeatedly switches between the "H" state and the "L" state. The state of the node N31 is output as an output signal of the n-MOS leak monitor 1 via the inverter 40.

In the measurement of the leakage current amount, the delay time caused by the delay circuits 12 and 22 (t7–t6=t4–t3=t1–t0) is determined by the structure of the delay circuits 12 and 22, and becomes a certain value. In addition, the time required for changing the state of the pulse signal generating circuit 30 (t3–t2, t6–t5, and t9–t8) is also determined by the structure of the pulse signal generating circuit 30, and becomes a certain value.

Therefore, the time required for half a cycle of oscillations of the node N31 (time t2 through time t5) is determined based on the time required for the potential of the node N12 to decrease to the potential Vref (time t4 to time t5) due to the leakage current flowing in the transistor QN10. Likewise, the time required for half a cycle of oscillations of the node N31 (time t5 through time t8) is determined based on the time required for the potential of the node N22 to decrease to the potential Vref (time t7 to time t8) due to the leakage current flowing in the transistor QN20. Accordingly, the pulse signal output from the n-MOS leak monitor 1 has a frequency determined based on the leakage currents flowing in the n-MOS transistors QN10 and QN20.

In the n-MOS leak monitor 1, while discharging is performed on the node N12 of the signal delay circuit 10 and the amount of the leakage current flowing in the transistor QN10 is measured, precharging is performed on the node N22 of the signal delay circuit 20. Likewise, while discharging is performed on the node N22 of the signal delay circuit 20 and the amount of the leakage current flowing in the transistor QN20 is measured, precharging is performed on the node N12 of the signal delay circuit 10. Since the n-MOS leak monitor 1 outputs the pulse signal based on the time required for the discharging of the nodes 12 and 22, the time required for the precharging of the nodes N12 and N22 is not reflected in the pulse signal output from the n-MOS leak monitor 1.

The oscillation counter 3 measures the leakage current amounts of the n-MOS transistors QN10 and QN20 by counting the number of oscillation of the pulse signal output from the n-MOS leak monitor 1. The n-MOS substrate control circuit 4 increases the substrate bias to be applied to the semiconductor substrate, if the values of the leakage current amounts in the n-MOS transistors QN10 and QN20 are smaller than a certain value. The n-MOS substrate control circuit 4 reduces the substrate bias to be applied to the semiconductor substrate, if the value of the leakage current amount in each transistor is equal to or larger than the certain value. The source voltage control circuit 6 reduces the source voltage, if the values of the leakage current amounts in the n-MOS transistors QN10 and QN20 are smaller than a certain value. The source voltage control circuit 6 increases the source voltage, if the value of the leakage current amount in each transistor is larger than the certain value.

Advantages of the Semiconductor Integrated Circuit of the First Embodiment

Figure 4:
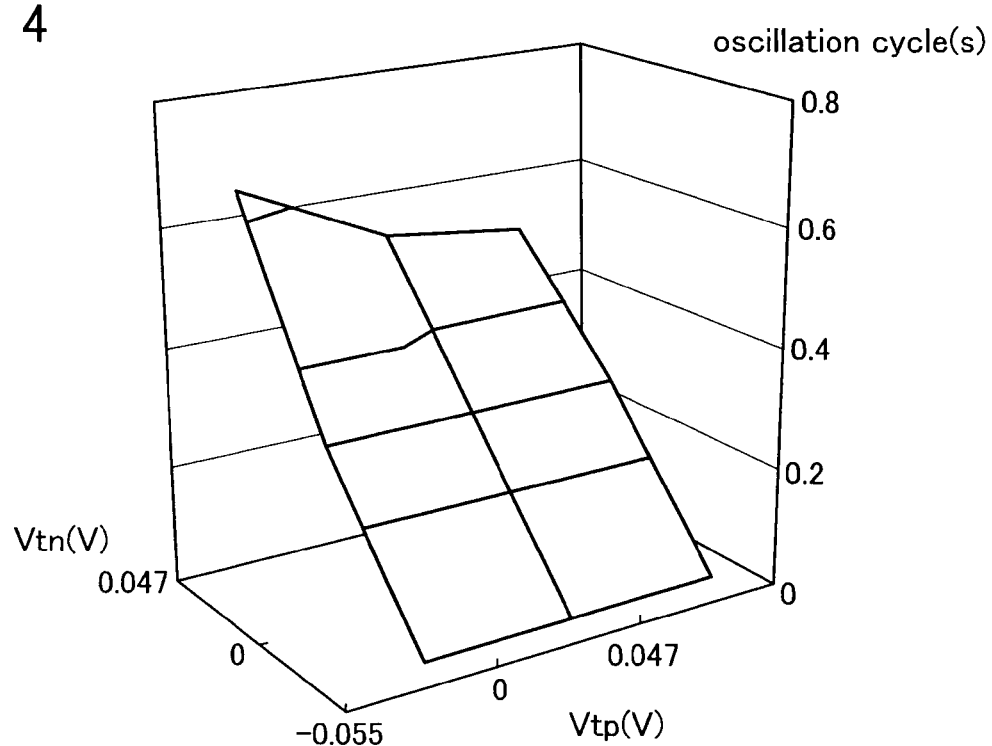
FIG. 4 is a graph illustrating the advantages of the semiconductor integrated circuit in accordance with the first embodiment.

As described above, the semiconductor integrated circuit of this embodiment has the n-MOS leak monitor 1 that outputs a signal having a frequency that is determined based on the leakage currents in the n-MOS transistors QN10 and QN20. The signal output from the n-MOS leak monitor 1 corresponds to a discharge speed of the node N11 and N12. FIG. 4 shows the results of a simulation performed to measure the leakage currents in the n-MOS transistors with the use of the n-MOS leak monitor 1 shown in FIG. 2. In FIG. 4, the axis Vtn indicates the threshold voltage of the n-MOS transistors QN10 and QN20 of the n-MOS leak monitor 1. The axis Vtp indicates the threshold voltage of the p-MOS transistors QP11 and QP12 or QP21 and QP22 of the n-MOS leak monitor 1. The points of the threshold voltage 0 (V) on the axis Vtn and the axis Vtp indicate cases where there are the threshold voltages required for the respective transistors, and the axis Vtn and the axis Vtp indicate the fluctuations from the required threshold voltages. The ordinate axis indicates the oscillation cycle of the pulse signal output from the n-MOS leak monitor 1.

As shown in FIG. 4, if the threshold voltage fluctuates as the leakage current amounts in the n-MOS transistors QN10 and QN20 change in the n-MOS leak monitor 1, the oscillation cycle of the pulse signal greatly changes. Meanwhile, if the threshold voltage fluctuates as the leakage currents in the p-MOS transistors QP11 and QP12 or QP21 and QP22 change, the oscillation cycle of the pulse signal hardly changes. Accordingly, the n-MOS leak monitor 1 can measure the leakage current amounts in the n-MOS transistors QN10 and QN20, regardless of the leakage current amounts in the p-MOS transistors QP11 and QP12 or QP21 and QP22.

In the n-MOS leak monitor 1, while discharging is performed on the node of one of the two n-MOS transistors QN10 and QN20 and the leakage current amount in the transistor is measured, precharging is performed on the node connected to the other transistor. Accordingly, the precharging time of the nodes N12 and N22 does not affect the measurement of the leakage currents in the n-MOS transistors QN10 and QN20.

In the n-MOS leak monitor 1, the p-MOS transistors QP11 and QP12 or QP21 and QP22 are connected in series. When the p-MOS transistors become nonconductive and the leakage currents in the n-MOS transistors are measured, the voltage of the intermediate node between the two p-MOS transistors becomes lower. As a result, the drain-source voltage of each p-MOS transistor becomes lower, and the leakage currents from the p-MOS transistors decrease. At the same time, a substrate bias is applied to the p-MOS transistors QP11 and QP21, and the leakage currents from the p-MOS transistors can be further reduced. In this manner, the measurement error due to the leakage currents from the p-MOS transistors QP11 and QP12 or QP21 and QP22 can be reduced.

As described above, the semiconductor integrated circuit in accordance with this embodiment can accurately measure the leakage current of each n-MOS transistor, without adverse influence from the p-MOS transistors.

Second Embodiment

Structure of the Semiconductor Integrated Circuit of the Second Embodiment

Figure 5:
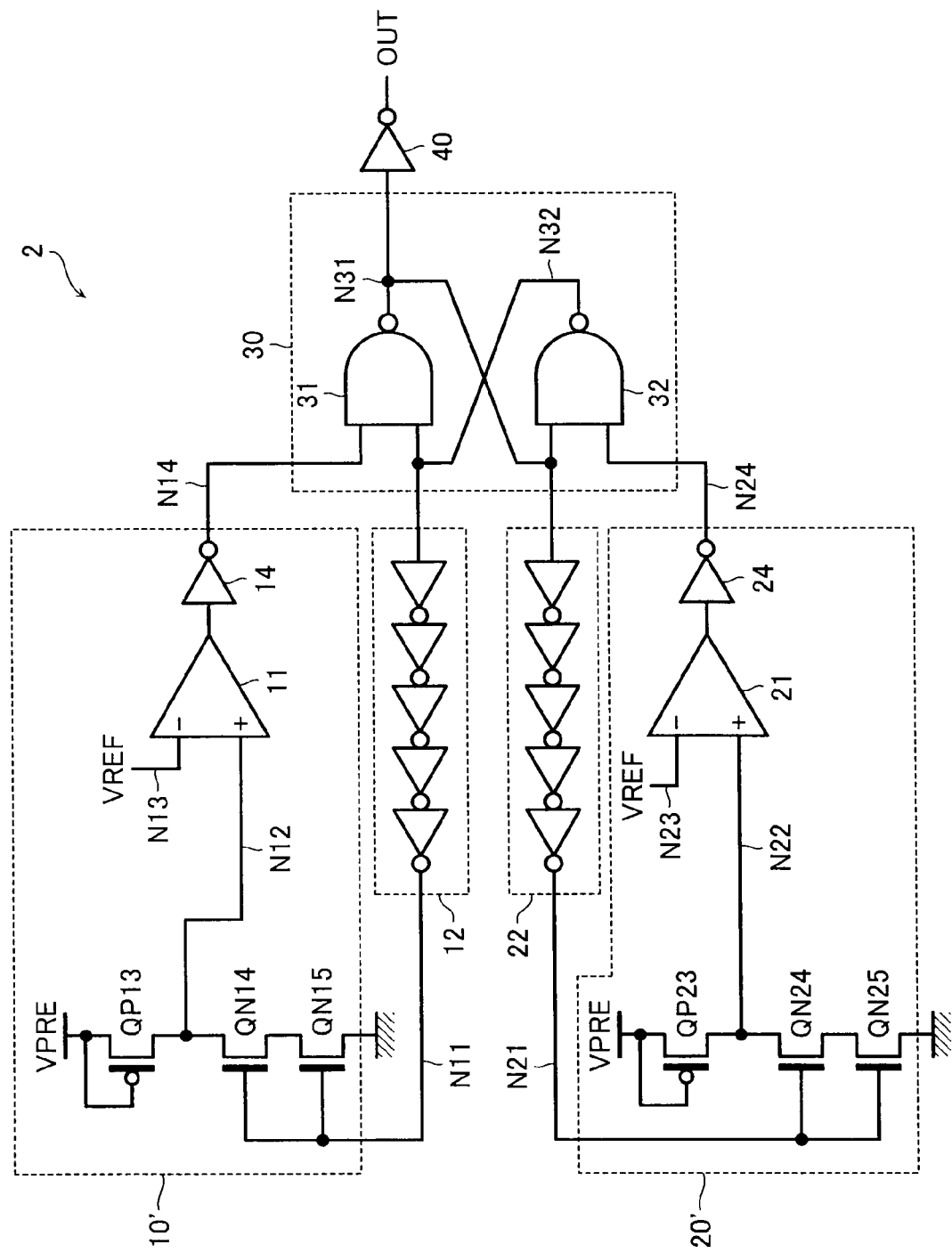
FIG. 5 is a circuit diagram showing a semiconductor integrated circuit in accordance with a second embodiment.

Referring now to FIG. 5, a second embodiment of a semiconductor integrated circuit in accordance with the present invention is described. FIG. 5 is a circuit diagram showing an example structure of a p-MOS leak monitor 2 in accordance with this embodiment.

The structure of the p-MOS leak monitor 2 in accordance with the second embodiment is substantially the same as the n-MOS leak monitor 1 in accordance with the first embodiment. In the p-MOS leak monitor 2 in accordance with the second embodiment, the same components as those of the first embodiment are denoted by the same reference numerals used in the first embodiment, and explanation of them is omitted herein. In the p-MOS leak monitor 2 in accordance with this embodiment, the structure of the signal delay circuit 10' differs from the structure of the signal delay circuit 10 of the first embodiment. The p-MOS leak monitor 2 of this embodiment also differs from the n-MOS leak monitor 1 of the first embodiment in that each of the delay circuits 12 and 22 is formed with an odd number of inverters.

The signal delay circuit 10' includes an n-MOS transistor QP13, n-MOS transistors QN14 and QN15, a comparator 11, and an inverter 14.

The p-MOS transistor QP13 has its drain connected to the node N12, and has its gate and source connected to a power supply VPRE (a voltage Vpre). The transistor QP13 precharges the node N12 by the leakage current flowing from the source thereof connected to the power supply VPRE to the drain thereof connected to the node N12, so as to increase the potential of the node N12. The p-MOS leak monitor 2 measures the leakage current amount in the p-MOS transistor QP13. Here, the transistor QP13 subject to the leakage current measurement is formed by the same procedures as the transistors used in the other circuits in the cores C, and has a certain relationship with other p-MOS transistors in the cores C in terms of characteristics.

The two n-MOS transistors QN14 and QN15 are connected in series. The drain of the transistor QN14 is connected to the node N12, and the source of the transistor QN15 is grounded. A node N11 is connected to the gates of the two transistors QN14 and QN15. When the potential of the node N11 is in a "H" state, the two transistors QN14 and QN15 become conductive, so as to discharge the node N12 and reduce the potential of the node N12.

The comparator 11 has input terminals connected to the node N12 and a node N13 connected to the power supply VREF (a potential Vref). If the potential of the node N12 is higher than the potential Vref of the node N13, the comparator 11 outputs a "H" signal to the inverter 14, and the inverter 14 outputs a "L" signal to the node N14. If the potential of the node N12 is lower than the potential Vref of the node N13, the comparator 11 outputs a "L" signal to the inverter 14, and the inverter 14 outputs a "H" signal to the node N14.

The signal delay circuit 10', as a whole, delays the signal input from the node N11 by the amount based on the leakage current amount in the p-MOS transistor QP13, and outputs the delayed signal to the node N14.

The delay circuits 12 and 22 each formed with an odd number of inverters invert the "H" signal or "L" signal of nodes N31 and N32 output from the pulse signal generating circuit 30, and then provide the inverted signal to the node N11.

The signal delay circuit 20' includes a p-MOS transistor QP23, n-MOS transistors QN24 and QN25, a comparator 21, and an inverter 24. The transistor QP23 of the signal delay circuit 20' is equivalent to the transistor QP13 of the signal delay circuit 10', and the n-MOS transistors QN24 and QN25, the comparator 21, and the inverter 24 have the same structures as the n-MOS transistors QN14 and 15, the comparator 11, and the inverter 14, respectively. Therefore, explanation of them is omitted herein.

In the signal delay circuits 10' and 20' in the p-MOS leak monitor 2, while precharging is performed on one of the nodes (the node N12, for example) and the leakage current amount in the transistor QP13 is measured, discharging is performed on the other node (the node N22, for example). Accordingly, the discharging time of one of the nodes N12 and N22 does not affect the leakage current measurement based on the precharging time of the other node.

Operation of the Semiconductor Integrated Circuit of the Second Embodiment

Figure 6:
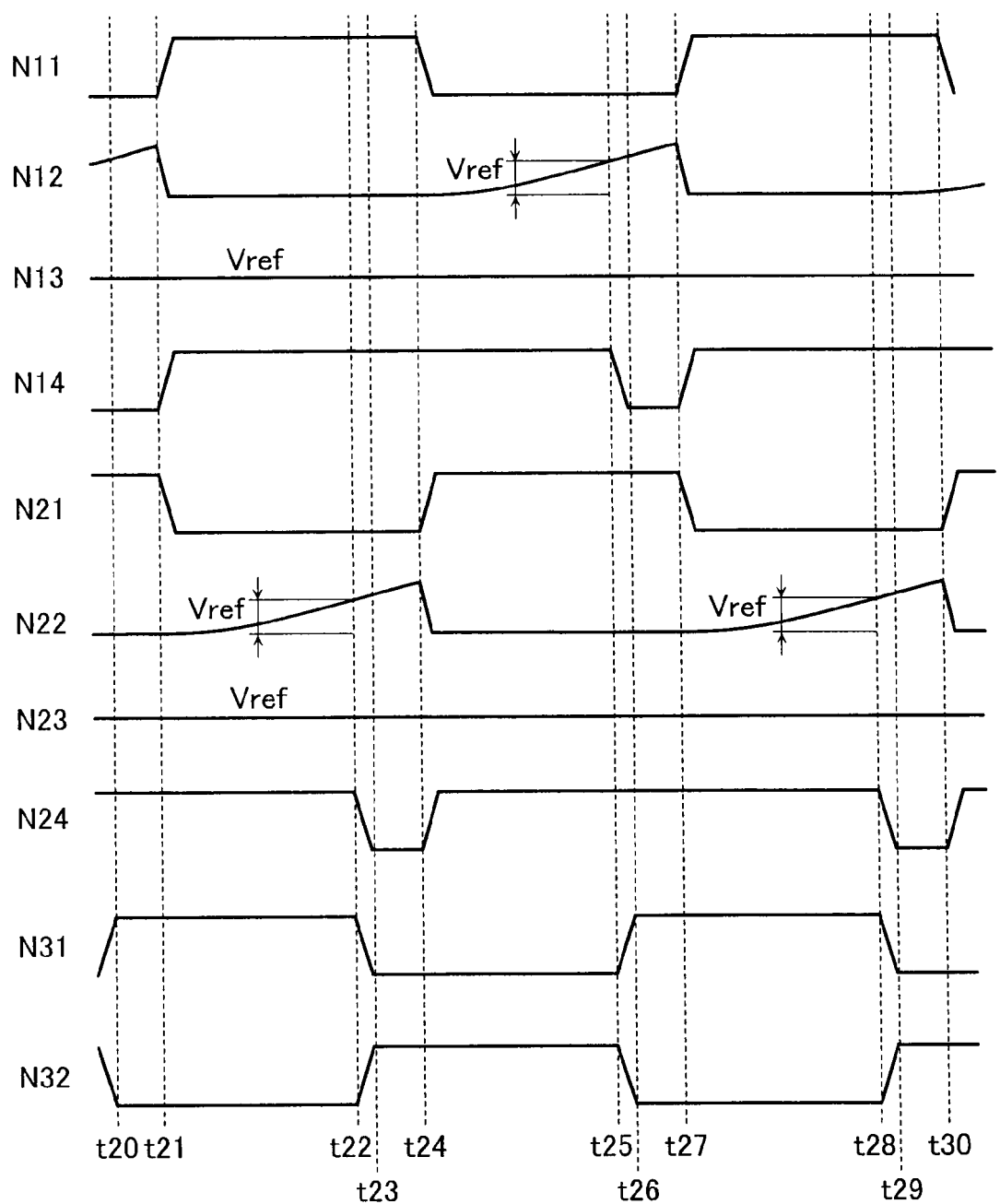
FIG. 6 is a timing chart showing the potentials of the respective nodes in the operation of the semiconductor integrated circuit in accordance with the second embodiment.

Referring now to FIG. 6, the operation of the p-MOS leak monitor 2 is described. FIG. 6 is a timing chart showing the potentials of the respective nodes in the operation of the p-MOS leak monitor 2 in accordance with this embodiment.

The p-MOS leak monitor 2 starts measuring the leakage currents in the p-MOS transistors QP13 and QP23, as the semiconductor integrated circuit starts operating. At time t20, the states of the nodes N31 and N32 that are output from the two logic gates 31 and 32 of the pulse signal generating circuit 30 switch from a "L" state to a "H" state, and from a "H" state to a "L" state, respectively. At time t20, each of the potentials of the nodes N12, N21, and N24 is in a "H" state, and each of the potentials of the nodes N11, N14, and N22 is in a "L" state.

At time t21, the potential of the node N31 having switched to the "H" state is inverted by the delay circuit 22, and is supplied to the node N21 with a certain delay. As a result, the node N21 changes from the "H" state to the "L" state. Likewise, the potential of the node N32 having switched to the "L" state is inverted by the delay circuit 12, and is supplied to the node N11 with a certain delay. As a result, the node N11 changes from the "L" state to the "H" state. Here, the delay time caused by the delay circuits 12 and 22 is expressed as t21−t20.

Due to the "H" state potential supplied to the node N11, the n-MOS transistors QN14 and QN15 become conductive, and the precharging of the node N12 is stopped. A current flows from the node N12 having the precharging stopped via the transistors QN14 and QN15, and the potential switches from the "H" state to the "L" state.

Meanwhile, since the potential of the node N21 is in the "L" state, the gates of the n-MOS transistors QN24 and QN25 are put into the "L" state. As a result, the n-MOS transistors QN24 and QN25 become nonconductive, and the node N22 is precharged with the leakage current from the p-MOS transistor QP23.

At time t22, when the potential of the node N22 becomes higher than the potential Vref of the node N23, the "H" state of the node N24 output from the comparator 21 via the inverter 24 is inverted to the "L" state.

At time t23, the potential of the node N24 switches from the "H" state to the "L" state, and the output signal of the pulse signal generating circuit 30 is also inverted. Accordingly, the "L" state of the node N24 is supplied to the logic gate 32, and the node N32 switches from the "L" state to the "H" state. The "H" state of the node N32 and the "H" state of the node N14 are supplied to the logic gate 31, and the node N31 switches from the "H" state to the "L" state.

At time t24, the potential of the node N32 having switched to the "H" state is inverted by the delay circuit 12, and is supplied to the node N11 with a certain delay. As a result, the node N11 switches from the "H" state to the "L" state. Likewise, the potential of the node N31 having switched to the "L" state is inverted by the delay circuit 22, and is supplied to the node N21 with a certain delay. As a result, the node N21 switches from the "L" state to the "H" state. Here, the delay time caused by the delay circuits 12 and 22 is expressed as t24−t23 (=t21−t20).

Since the potential of the node N11 is in the "L" state, the gate of each of the n-MOS transistors QN14 and QN15 is put into the "L" state. As a result, the n-MOS transistors QN14 and QN15 become nonconductive, and the node N12 is precharged with the leakage current from the p-MOS transistor QP13.

Due to the "H"-state potential supplied to the node N21, the n-MOS transistors QN24 and QN25 become conductive, and the precharging of the node N22 is stopped. A current flows from the node N22 having the precharging stopped via the transistors QN24 and QN25, and the potential switches from the "H" state to the "L" state.

As described above, in the p-MOS leak monitor 2, while precharging is performed on the node N12 of the signal delay circuit 10' and the amount of the leakage current flowing in the transistor QP13 is measured, discharging is performed on the node N22 of the signal delay circuit 20'. Accordingly, the discharging time of the node N22 does not affect the leakage current measurement based on the precharging time of the node N12.

At time t25, when the potential of the node N12 becomes higher than the potential Vref of the node N13, the "H" state of the node N14 output from the comparator 11 via the inverter 14 is inverted to the "L" state.

At time t26, the potential of the node N14 switches from the "H" state to the "L" state, and the output signal of the pulse signal generating circuit 30 is also inverted. Accordingly, the "L" state of the node N14 is supplied to the logic gate 31, and the node N31 switches from the "L" state to the "H" state. The "H" state of the node N31 and the "H" state of the node N24 are supplied to the logic gate 32, and the node N32 switches from the "H" state to the "L" state.

At time t27, the potential of the node N31 having switched to the "H" state is inverted by the delay circuit 22, and is supplied to the node N21 with a certain delay. As a result, the node N21 switches from the "H" state to the "L" state. Likewise, the potential of the node N32 having switched to the "L" state is inverted by the delay circuit 12, and is supplied to the node N11 with a certain delay. As a result, the node N11 switches from the "L" state to the "H" state. Here, the delay time caused by the delay circuits 12 and 22 is expressed as t27−t26 (=t24−t23=t21−t20).

Due to the "H"-state potential supplied to the node N11, the n-MOS transistors QN14 and QN15 become conductive, and the precharging of the node N12 is stopped. A current flows from the node N12 having the precharging stopped via the transistors QN14 and QN15, and the potential switches from the "H" state to the "L" state.

Meanwhile, since the potential of the node N21 is in the "L" state, the gate of each of the n-MOS transistors QN24 and QN25 is put into the "L" state. As a result, the n-MOS transistors QN24 and QN25 become nonconductive, and the node N22 is precharged with the leakage current from the p-MOS transistor QP23.

At time t28, the potentials of the respective nodes become the same as the potentials observed at time t22. At time t28, time t29, time t30 . . . , the p-MOS leak monitor 2 repeats a procedure carried out at time t22, time t23, time t24 in a similar way.

Accordingly, the state of the node N31 repeatedly switches between the "H" state and the "L" state. The state of the node N31 is output as an output signal of the p-MOS leak monitor 2 via the inverter 40.

In the measurement of the leakage current amount, the delay time caused by the delay circuits 12 and 22 (t27−t26=t24−t23=t21−t20) is determined by the structure of the delay circuits 12 and 22, and becomes a certain value. In addition, the time required for changing the state of the pulse signal generating circuit 30 (t23−t22, t26−t25, and t29−t28) is also determined by the structure of the pulse signal generating circuit 30, and becomes a certain value.

Therefore, the time required for half a cycle of oscillations of the node N31 (time t22 through time t25) is determined based on the time required for the potential of the node N12 to increase to the potential Vref (time t24 to time t25) due to the leakage current flowing in the transistor QP13. Likewise, the time required for half a cycle of oscillations of the node N31 (time t25 through time t28) is determined based on the time required for the potential of the node N22 to increase to the potential Vref (time t27 to time t28) due to the leakage current flowing in the transistor QP23. Accordingly, the pulse signal output from the p-MOS leak monitor 2 has a frequency determined based on the leakage currents flowing in the p-MOS transistors QP13 and QP23.

In the p-MOS leak monitor 2, while precharging is performed on the node N12 of the signal delay circuit 10' and the amount of the leakage current flowing in the transistor QP13 is measured, discharging is performed on the node N22 of the signal delay circuit 20'. Likewise, while precharging is performed on the node N22 of the signal delay circuit 20' and the amount of the leakage current flowing in the transistor QP23 is measured, discharging is performed on the node N12 of the signal delay circuit 10'. Since the p-MOS leak monitor 2 outputs the pulse signal based on the time required for the precharging of the nodes 12 and 22, the time required for the discharging of the nodes N12 and N22 is not reflected in the pulse signal output from the p-MOS leak monitor 2.

The oscillation counter 3 measures the leakage current amounts of the p-MOS transistors QP13 and QP23 by counting the number of oscillation of the pulse signal output from the p-MOS leak monitor 2. The p-MOS substrate control circuit 5 increases the substrate bias to be applied to the semiconductor substrate, if the values of the leakage current amounts in the p-MOS transistors QP13 and QP23 are smaller than a certain value. The p-MOS substrate control circuit 5 reduces the substrate bias to be applied to the semiconductor substrate, if the value of the leakage current amount in each transistor is equal to or larger than the certain value. The source voltage control circuit 6 reduces the source voltage, if the values of the leakage current amounts in the p-MOS transistors QP13 and QP23 are smaller than a certain value. The source voltage control circuit 6 increases the source voltage, if the value of the leakage current amount in each transistor is larger than the certain value.

Advantages of the Semiconductor Integrated Circuit of the Second Embodiment

Figure 7:
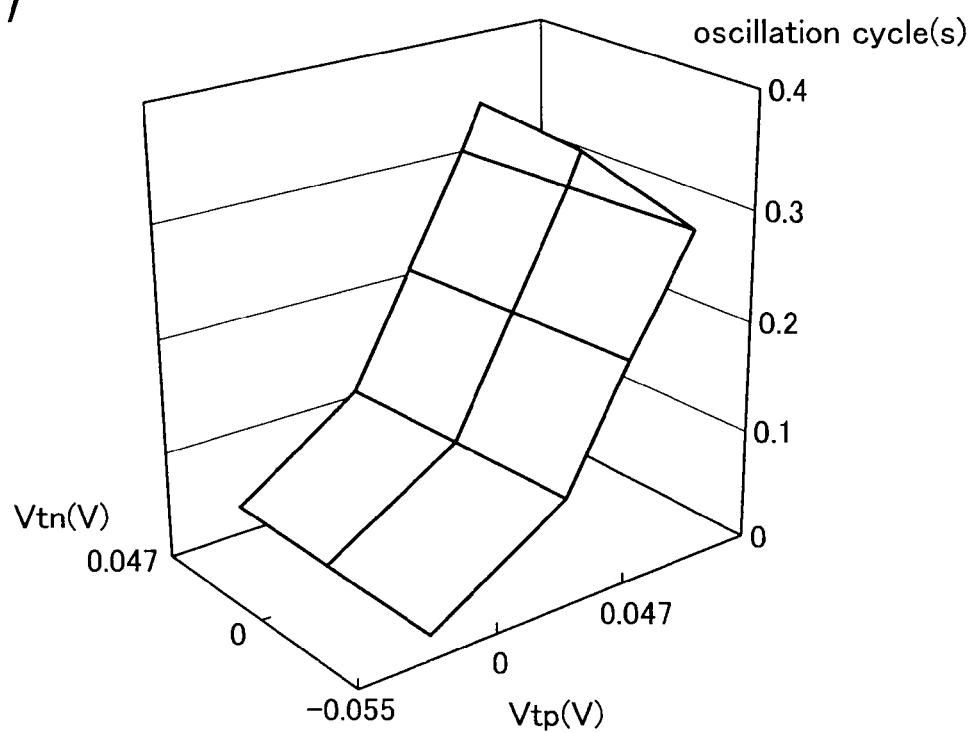
FIG. 7 is a graph illustrating the advantages of the semiconductor integrated circuit in accordance with the second embodiment.

As described above, the semiconductor integrated circuit of this embodiment has the p-MOS leak monitor 2 that outputs a signal having a frequency that is determined based on the leakage currents in the p-MOS transistors QP13 and QP23. The signal output from the p-MOS leak monitor 2 corresponds to a precharge speed of the node N11 and N12. FIG. 7 shows the results of a simulation performed to measure the leakage currents in the p-MOS transistors with the use of the p-MOS leak monitor 2 shown in FIG. 5.

As shown in FIG. 7, if the threshold voltage fluctuates as the leakage current amounts in the p-MOS transistors QP13 and QP23 change in the p-MOS leak monitor 2, the oscillation cycle of the pulse signal greatly changes. Meanwhile, if the threshold voltage fluctuates as the leakage currents in the n-MOS transistors QN14 and QN15 or QN24 and QN25 change, the oscillation cycle of the pulse signal hardly changes. Accordingly, the p-MOS leak monitor 2 can measure the leakage current amounts in the p-MOS transistors QP13 and QP23, regardless of the leakage current amounts in the n-MOS transistors QN14 and QN15 or QN24 and QN25.

In the p-MOS leak monitor 2, while precharging is performed on the node of one of the two p-MOS transistors QP13 and QP23 and the leakage current amount in the transistor is measured, discharging is performed on the node connected to the other transistor. Accordingly, the discharging time of the nodes N12 and N22 does not affect the measurement of the leakage currents in the p-MOS transistors QP13 and QP23.

In the p-MOS leak monitor 2, the n-MOS transistors QN14 and QN15 or QN24 and QN25 are connected in series. Accordingly, the measurement error due to the leakage currents to the n-MOS transistors QN14 and QN15 or QN24 and QN25 can be reduced, as in the first embodiment.

As described above, the semiconductor integrated circuit in accordance with this embodiment can accurately measure the leakage current of each p-MOS transistor, without adverse influence from the n-MOS transistors.

Although the embodiments of the present invention have been described, the present invention is not limited to those specific examples, and various modifications, additions, and combinations may be made to them in a range without departing from the scope of the invention. For example, each pair of the p-MOS transistors QP11 and QP12 and the p-MOS transistors QP21 and QP22 of the first embodiment, and then-MOS transistors QN14 and QN15 and the n-MOS transistors QN24 and QN25 of the second embodiment are connected in series. However, each of those pairs may be formed with one transistor. Also, the pulse signal generating unit 30 includes NAND gates as the logic gates 31 and 32. However, NOR gates may be used as the logic gates to form the pulse signal generating unit 30.

What is claimed is:

1. A semiconductor integrated circuit comprising:
a first signal delay circuit including a first discharge element having one end connected to a first node and configured to be switched between a conductive state and a nonconductive state by a first control signal to discharge the first node, a first precharge element connected between the first node and a power supply and configured to precharge the first node with a leakage current, and a first signal output circuit configured to compare a potential of the first node with a reference potential to output a first signal;
a second signal delay circuit including a second discharge element having one end connected to a second node and configured to be switched between a conductive state and a nonconductive state by a second control signal to discharge the second node, a second precharge element connected between the second node and a power supply and configured to precharge the second node with a leakage current, and a second signal output circuit configured to compare a potential of the second node with a reference potential to output a second signal;
a pulse signal generating circuit configured to generate a pulse signal having a pulse width determined by the first and second signals;
a first delay circuit configured to delay the pulse signal to output the first control signal; and
a second delay circuit configured to delay an inverted signal of the pulse signal to output the second control signal,
the first signal delay circuit being configured to discharge the first node via the first discharge element, while the second signal delay circuit precharges the second node via the second precharge element and outputs the second signal; and
the second signal delay circuit being configured to discharge the second node via the second discharge element, while the first signal delay circuit precharges the first node via the first precharge element and outputs the first signal.

2. The semiconductor integrated circuit according to claim 1, wherein each of the first discharge element and the second discharge element is formed with a plurality of transistors connected in series.

3. The semiconductor integrated circuit according to claim 1, wherein each of the first precharge element and the second precharge element is a p-MOS transistor.

4. The semiconductor integrated circuit according to claim 1, further comprising
a substrate bias control circuit configured to control a substrate bias applied to a semiconductor substrate, based on the pulse signal.

5. The semiconductor integrated circuit according to claim 1, further comprising
a source voltage control circuit configured to control a source voltage, based on the pulse signal.

6. The semiconductor integrated circuit according to claim 1, further comprising:
a third signal delay circuit including a third precharge element connected between a third node and a power supply and configured to be switched between a conductive state and a nonconductive state by a third control signal to precharge the third node, a third discharge element having one end connected to the third node and configured to discharge the third node with a leakage current, and a third signal output circuit configured to compare a potential of the third node with a reference potential to output a third signal;
a fourth signal delay circuit including a fourth precharge element connected between a fourth node and a power supply and configured to be switched between a conductive state and a nonconductive state by a fourth control signal to precharge the fourth node, a fourth discharge element having one end connected to the fourth node and configured to discharge the fourth node with a leakage current, and a fourth signal output circuit configured to compare a potential of the fourth node with a reference potential to output a fourth signal;
a pulse signal generating circuit configured to generate a pulse signal having a pulse width determined by the third and fourth signals;
a third delay circuit configured to delay the pulse signal to output the third control signal; and
a fourth delay circuit configured to delay an inverted signal of the pulse signal to output the fourth control signal,
the third signal delay circuit being configured to precharge the third node via the third precharge element, while the fourth signal delay circuit discharges the fourth node via the fourth discharge element and outputs the fourth signal; and
the fourth signal delay circuit being configured to precharge the fourth node via the fourth precharge element, while the third signal delay circuit discharges the third node via the third discharge element and outputs the third signal.

7. The semiconductor integrated circuit according to claim 6, wherein each of the first discharge element, the second discharge element, the third precharge element, and the fourth precharge element is formed with a plurality of transistors connected in series.

8. The semiconductor integrated circuit according to claim 6, wherein each of the first precharge element and the second precharge element is a p-MOS transistor.

9. The semiconductor integrated circuit according to claim 6, wherein each of the third discharge element and the fourth discharge element is an n-MOS transistor.

10. The semiconductor integrated circuit according to claim 6, further comprising
a substrate bias control circuit configured to control a substrate bias applied to a semiconductor substrate, based on the pulse signal.

11. The semiconductor integrated circuit according to claim 6, further comprising
a source voltage control circuit configured to control a source voltage, based on the pulse signal.

12. A semiconductor integrated circuit comprising:
a third signal delay circuit including a third precharge element connected between a third node and a power supply and configured to be switched between a conductive state and a nonconductive state by a third control signal to precharge the third node, a third discharge element having one end connected to the third node and configured to discharge the third node with a leakage current, and a third signal output circuit configured to compare a potential of the third node with a reference potential to output a third signal;
a fourth signal delay circuit including a fourth precharge element connected between a fourth node and a power supply and configured to be switched between a conductive state and a nonconductive state by a fourth control signal to precharge the fourth node, a fourth discharge element having one end connected to the fourth node and configured to discharge the fourth node with a leakage current, and a fourth signal output circuit configured to compare a potential of the fourth node with a reference potential to output a fourth signal;
a pulse signal generating circuit configured to generate a pulse signal having a pulse width determined by the third and fourth signals;
a third delay circuit configured to delay the pulse signal to output the third control signal; and
a fourth delay circuit configured to delay an inverted signal of the pulse signal to output the fourth control signal,
the third signal delay circuit being configured to precharge the third node via the third precharge element, while the fourth signal delay circuit discharges the fourth node via the fourth discharge element and outputs the fourth signal; and
the fourth signal delay circuit being configured to precharge the fourth node via the fourth precharge element, while the third signal delay circuit discharges the third node via the third discharge element and outputs the third signal.

13. The semiconductor integrated circuit according to claim 12, wherein each of the third precharge element and the fourth precharge element is formed with a plurality of transistors connected in series.

14. The semiconductor integrated circuit according to claim 12, wherein each of the third discharge element and the fourth discharge element is an n-MOS transistor.

15. The semiconductor integrated circuit according to claim 12, further comprising
a substrate bias control circuit configured to control a substrate bias applied to a semiconductor substrate, based on the pulse signal.

16. The semiconductor integrated circuit according to claim 12, further comprising
a source voltage control circuit configured to control a source voltage, based on the pulse signal.

17. A semiconductor integrated circuit comprising:
a first signal output circuit including a first precharge element connected between a first node and a power supply and configured to precharge the first node with a leakage current, the first signal output circuit being configured to output a first signal corresponding to a precharge speed of the first node;

a second signal output circuit including a second precharge element connected between a second node and a power supply and configured to precharge the second node with a leakage current, the second signal output circuit being configured to output a second signal corresponding to a precharge speed of the second node; and a pulse signal generating circuit configured to generate a pulse signal having a pulse width determined by the first and second signals, the first signal output circuit being configured to discharge the first node, while the second signal output circuit precharges the second node via the second precharge element and outputs the second signal; and the second signal output circuit being configured to discharge the second node, while the first signal output circuit precharges the first node via the first precharge element and outputs the first signal.

18. The semiconductor integrated circuit according to claim 17, wherein each of the first precharge element and the second precharge element is a p-MOS transistor.

19. The semiconductor integrated circuit according to claim 17, further comprising:

a third signal output circuit including a first discharge element connected between a third node and a ground potential and configured to discharge the third node with a leakage current, the third signal output circuit being configured to output a third signal corresponding to a discharge speed of the third node;

a fourth signal output circuit including a second discharge element connected between a fourth node and a ground potential and configured to discharge the fourth node with a leakage current, the fourth signal output circuit being configured to output a fourth signal corresponding to a discharge speed of the fourth node; and a pulse signal generating circuit configured to generate a pulse signal having a pulse width determined by the third and fourth signals, the third signal output circuit being configured to precharge the third node, while the fourth signal output circuit discharges the fourth node via the second discharge element and outputs the fourth signal; and the fourth signal output circuit being configured to precharge the fourth node, while the third signal output circuit discharges the third node via the first discharge element and outputs the third signal.

20. The semiconductor integrated circuit according to claim 19, wherein each of the first discharge element and the second discharge element is an n-MOS transistor.

* * * * *